(12) United States Patent
Park et al.

(10) Patent No.: US 9,786,430 B2
(45) Date of Patent: Oct. 10, 2017

(54) SPACE-ADAPTIVE WIRELESS POWER TRANSFER SYSTEM AND METHOD USING EVANESCENT FIELD RESONANCE

(75) Inventors: Young Jin Park, Gyeonggi-do (KR); Soon Wo Lee, Gyeonggi-do (KR); Ji Myung Kang, Gyeonggi-do (KR); Jin Wook Kim, Gyeonggi-do (KR); Kwan Ho Kim, Seoul (KR)

(73) Assignee: KOREA ELECTROTECHNOLOGY RESEARCH INSTITUTE, Changwon (KR)

( * ) Notice: Subject to any disclaimer, the term of this patent is extended or adjusted under 35 U.S.C. 154(b) by 1104 days.

(21) Appl. No.: 13/508,345

(22) PCT Filed: Sep. 17, 2010

(86) PCT No.: PCT/KR2010/006447
§ 371 (c)(1),
(2), (4) Date: Jul. 30, 2012

(87) PCT Pub. No.: WO2011/055905
PCT Pub. Date: May 12, 2011

(65) Prior Publication Data
US 2012/0286584 A1    Nov. 15, 2012

(30) Foreign Application Priority Data

Nov. 4, 2009 (KR) .......................... 10-2009-0105919
Sep. 15, 2010 (KR) .......................... 10-2010-0090388

(51) Int. Cl.
*H01F 38/14*    (2006.01)
*H01F 27/00*    (2006.01)
(Continued)

(52) U.S. Cl.
CPC .......... *H01F 38/14* (2013.01); *H01F 27/006* (2013.01); *H02J 5/005* (2013.01); *H02J 50/12* (2016.02); *H02J 50/50* (2016.02); *H03H 7/38* (2013.01)

(58) Field of Classification Search
CPC ......... H01F 27/006; H01F 38/14; H02J 5/005
(Continued)

(56) References Cited

U.S. PATENT DOCUMENTS 3,800,802 A * 4/1974 Berry ...................... A61N 1/40
                                                                607/64
4,614,925 A * 9/1986 Kane ...................... H03H 5/02
                                                                333/174
(Continued)

FOREIGN PATENT DOCUMENTS

JP    2006-517778 A    7/2006
KR    10-0389175 B1    6/2003
(Continued)

OTHER PUBLICATIONS

International Search Report for PCT/KR2010/006447 dated Sep. 17, 2010.

*Primary Examiner* — Rexford Barnie
*Assistant Examiner* — Elim Ortiz

(57) ABSTRACT

A magnetic resonance wireless power transfer method according to an aspect of the present invention includes transmitting power from a source coil to the Tx resonant coil using a magnetic induction method, transmitting the power from the Tx resonant coil to an Rx resonant coil, having a resonant frequency identical with that of the Tx resonant coil, via magnetically-coupled resonance, and transmitting the power from the Rx resonant coil to the device coil of an electronic device using the magnetic induction method. The Tx resonant coil and the Rx resonant coil are arranged at a
(Continued)

right angle or a specific angle of inclination relative to each other.

21 Claims, 18 Drawing Sheets

(51) Int. Cl.
    *H02J 5/00*         (2016.01)
    *H02J 50/12*       (2016.01)
    *H03H 7/38*        (2006.01)
    *H02J 50/50*       (2016.01)

(58) Field of Classification Search
    USPC .......................................................... 307/104
    See application file for complete search history.

(56) References Cited

U.S. PATENT DOCUMENTS

| | | | | |
|---|---|---|---|---|
| 4,619,001 A * | 10/1986 | Kane | ................... | H03B 5/1841 |
| | | | | 330/305 |
| 5,808,587 A * | 9/1998 | Shima | ................ | G07C 9/00103 |
| | | | | 340/10.34 |
| 6,215,374 B1 * | 4/2001 | Petrovic | .............. | H03H 7/1775 |
| | | | | 333/177 |
| 6,960,968 B2 * | 11/2005 | Odendaal | ........... | H01F 17/0006 |
| | | | | 320/110 |
| 2006/0132257 A1 * | 6/2006 | Wang | ....................... | H04B 3/28 |
| | | | | 333/12 |
| 2007/0021088 A1 * | 1/2007 | Sheng-Fuh | ............ | H03F 1/565 |
| | | | | 455/319 |
| 2007/0145830 A1 * | 6/2007 | Lee | ........................ | H02J 5/005 |
| | | | | 307/135 |
| 2008/0266748 A1 * | 10/2008 | Lee | ......................... | H02J 5/005 |
| | | | | 361/270 |
| 2009/0083079 A1 * | 3/2009 | Law | ....................... | G06F 19/328 |
| | | | | 705/4 |
| 2009/0134711 A1 * | 5/2009 | Issa | ......................... | H01Q 7/00 |
| | | | | 307/104 |
| 2010/0033021 A1 * | 2/2010 | Bennett | ................... | H02J 17/00 |
| | | | | 307/104 |
| 2010/0044333 A1 * | 2/2010 | Marvel | .................... | B61G 5/10 |
| | | | | 213/1.3 |
| 2010/0052431 A1 * | 3/2010 | Mita | ..................... | B60L 11/182 |
| | | | | 307/104 |
| 2010/0148589 A1 * | 6/2010 | Hamam | ............... | H04B 5/0037 |
| | | | | 307/104 |
| 2011/0101788 A1 * | 5/2011 | Sun | ......................... | H01F 38/14 |
| | | | | 307/104 |
| 2011/0163609 A1 * | 7/2011 | Wada | ...................... | H02J 5/005 |
| | | | | 307/104 |
| 2011/0234012 A1 * | 9/2011 | Yi | ............................ | H02J 5/005 |
| | | | | 307/104 |
| 2011/0285349 A1 * | 11/2011 | Widmer | ................ | B60L 11/182 |
| | | | | 320/108 |
| 2012/0133214 A1 * | 5/2012 | Yun | .......................... | H03H 3/00 |
| | | | | 307/104 |
| 2012/0193997 A1 * | 8/2012 | Hong | .................... | H01Q 7/005 |
| | | | | 307/104 |
| 2013/0113298 A1 * | 5/2013 | Ryu | ........................ | H01F 38/14 |
| | | | | 307/104 |

FOREIGN PATENT DOCUMENTS

| | | | |
|---|---|---|---|
| KR | 10-2005-0013605 A | 2/2005 | |
| KR | 10-2009-0050912 A | 5/2009 | |

* cited by examiner

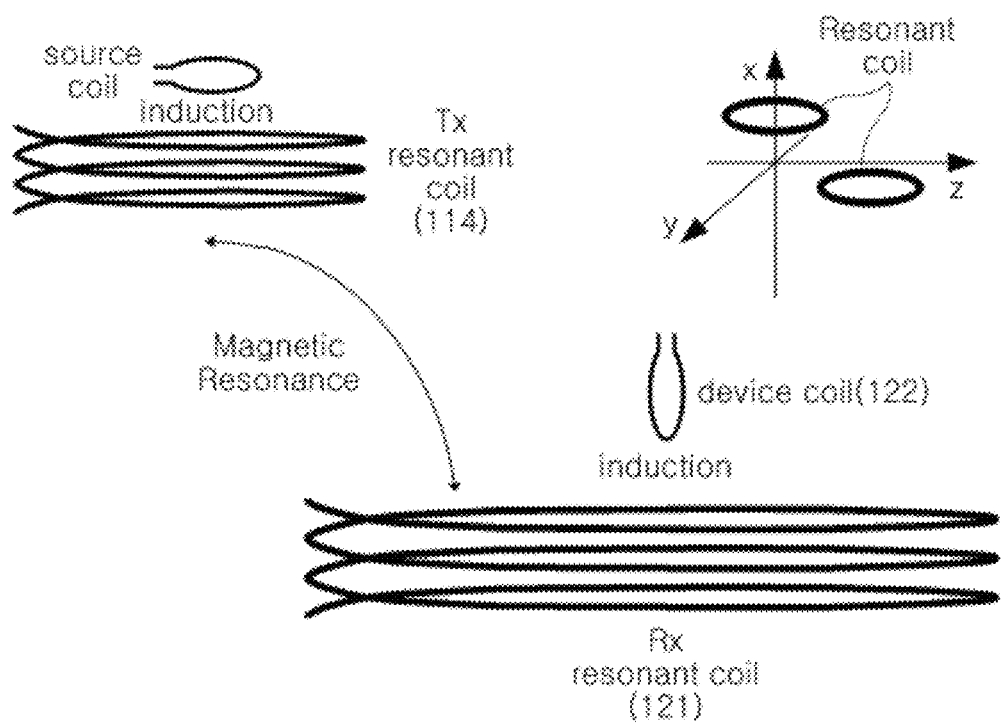

SPACE-ADAPTIVE WIRELESS POWER TRANSFER SYSTEM AND METHOD USING EVANESCENT FIELD RESONANCE

TECHNICAL FIELD

The present invention relates generally to a wireless power transfer system and method using magnetically-coupled resonance of the evanescent field which is generated around a wireless power transmitting coil and, more particularly, to a space-adaptive magnetically-coupled resonance wireless power transfer system and method, in which the resonant coil of a power receiving unit and the resonant coil of a power transmitting unit are configured to have the same resonant frequency so that magnetic field is coupled between the transmitting (Tx) resonant coil and the receiving (Rx) resonant coil, and the Tx and Rx resonant coils are placed on a plane having a right angle or a specific angle so that power transfer is efficient even when the center axis of the power receiving unit has not been aligned with the center axis of the power transmitting unit (i.e., when the center axis of the power receiving unit has to be vertical to the center axis of the power transmitting unit or the center axis of the power receiving unit has to have a specific angle of inclination relative to the center axis of the power transmitting unit), with the result that power is stably supplied to an electronic device having the device coil of a power receiving unit contained therein, such as a mobile phone, when the electronic device is brought into contact with the power transmitting unit.

BACKGROUND ART

Recently, active research is being carried out into wireless power transfer using magnetic induction in a low frequency band. However, the method using magnetic induction is disadvantageous in that power can be transmitted only within a short range of a few centimeters. Furthermore, there are many difficulties in applying this method using magnetic induction to wireless power transfer systems because it has very low efficiency when the arrangements of Tx and Rx coils are not identical with each other.

Korean Patent No. 10-0809461 discloses a configuration which is capable of increasing the power receiving distance by using an electromagnetic amplification relay employing LC resonance. In this patent, a method is used of performing LC resonance using a variable capacitor in a solenoid-type coil in which an induction coil is wound on a magnetic body to increase magnetic flux. This method uses separate LC resonant coils in Tx and Rx units, unlike the existing configuration used for magnetic induction. In this patent, the distance and efficiency of power transfer can be increased, as described above. In the invention disclosed in this patent, the resonant frequencies of the Tx and Rx power resonant coils are tuned using the variable capacitor. However, this invention has a disadvantage in that it is difficult to precisely adjust the value of the variable capacitor to a value which matches the resonant frequency. Furthermore, this preceding patent discloses wireless power transfer using only a parallel arrangement between the resonant coils, and therefore it is difficult to put this prior patent to practical use in a variety of ways.

Furthermore, U.S. Patent Application Publication No. US 2009/0224856 A1 discloses a wireless power transfer method using magnetically coupled resonance. This U.S. Patent discloses the general details of a magnetically coupled resonance method, and discloses elements related to the Q factor and the resonant frequency. This patent presents a scheme for improving power transmission efficiency and transmission distance using a magnetic resonant structure having the same resonant frequency and very strong magnetic coupling.

In U.S. Patent Application Publication No. US 2009/0072629 A1, resonant coils are constructed using a variable capacitor by means of a method similar to that of a Korean patent (Korean Patent No. 10-080941).

U.S. Patent Application Publication No. US 2009/0153273 A1 proposes a method of improving transmission distance and efficiency by adding additional resonant coils between Tx and Rx resonant coils that are arranged coaxially with the Tx and Rx power resonant coils as well. However, this method relates to a serial arrangement made by taking into consideration higher coupling constant between the Tx and Rx power resonant coils, and all the resonant coils are on the same plane. If all the resonant coils are on the same plane, the coupling constant between the resonant coils is reduced, and transmission efficiency is deteriorated.

The four conventional patents do not describe the arrangement of the coils, and attempt a method of improving power transfer efficiency and transmission distance on the assumption that all the coils are in a parallel arrangement (that is, axis of each coil is identical with one another). If only the parallel arrangement is used, however, there is the need for a solution capable of solving difficulties that occur when the parallel arrangement is applied to real life because of spatial limitations. Furthermore, in order to freely situate a power receiving unit, there is the need for a method that enables power transmission even in a vertical arrangement or various arrangements between the transmitting and receiving coils, but there has been no solution for such a method.

DISCLOSURE

Technical Problem

Accordingly, the present invention has been made keeping in mind the above problems occurring in the prior art, and an object of the present invention is to provide a space-adaptive magnetic resonance wireless power transfer system and method, which are capable of solving the directionality problem of a magnetic induction method and allowing for power transfer even in various spatial arrangements between transmitting (Tx) resonant coil and receiving (Rx) resonant coil based on the characteristic that magnetic resonant coils are less influenced by directionality, in such a way as to present the characteristics of the directionality of a magnetic resonance method acquired by making quantitative and qualitative characteristic analysis into the directionality characteristic the magnetic resonant coils in which there occurs magnetic resonance of evanescent field generated around a wireless power transmitting coil.

Another object of the present invention is to provide a space-adaptive magnetic resonance wireless power transfer system and method, which are capable of providing a power transfer method suitable for various lateral and vertical spaces by arranging magnetic resonant coils in various ways in order to extend the energy transmission distance by combining the positions of the magnetic resonant coils in various ways based on the characteristic that magnetic resonant coils are less influenced by directionality.

Yet another object of the present invention is to provide a space-adaptive magnetic resonance wireless power transfer system and method using a coil in helical or spiral form, which are capable of overcoming the spatial limitations of a parallel arrangement by arranging resonant coils at a right angle or a specific angle of inclination, and allowing Tx and Rx resonant coils to resonate in open form.

Technical Solution

First, the features of the present invention will be summarized. In one aspect of the present invention configured to achieve the objects, a magnetic resonance wireless power transfer method includes transferring power from a source coil to a Tx resonant coil using an magnetic induction method; transferring the power from the Tx resonant coil to an Rx resonant coil, having a same resonant frequency, via magnetically-coupled resonance of magnetic evanescent field with non-directive behavior; and transferring the power from the Rx resonant coil to a device coil of an electronic device using the magnetic induction method; wherein in order to transfer the power irrespective of directionality, the Tx resonant coil and the Rx resonant coil are arranged at a right angle or a specific angle of inclination relative to each other so that center axes of the Tx resonant coil and the Rx resonant coil are not parallel to each other, or the Tx resonant coil and the Rx resonant coil are arranged so that the center axes of the Tx resonant coil and the Rx resonant coil are parallel to each other but the center axes are not identical with each other.

In another aspect of the present invention, a magnetic resonance wireless power transfer method includes transferring power from a source coil to a Tx resonant coil using a magnetic induction method; transferring the power from the Tx resonant coil to an intermediate resonant coil, having a resonant frequency identical with that of the Tx resonant coil, via magnetically-coupled resonance of magnetic evanescent field with non-directive property; transferring the power from the intermediate resonant coil to an Rx resonant coil, having a resonant frequency identical with the Rx resonant coil, via magnetic resonance coupling; and transferring the power from the Rx resonant coil to a device coil of an electronic device using an magnetic induction method; wherein the intermediate resonant coil is placed at a right angle or an angle of inclination relative to the Tx resonant coil and the Rx resonant coil.

In still another aspect of the present invention, a magnetically-coupled resonance wireless power transfer system includes a source coil configured to be supplied with power from a source; a Tx resonant coil configured to be supplied with the power from the source coil using a magnetic induction method; and an Rx resonant coil configured to be supplied with the power from the Tx resonant coil at a resonant frequency identical with that of the Tx resonant coil via magnetically-coupled resonance of magnetic evanescent field with non-directive property, wherein in order to transfer the power irrespective of directionality, the Tx resonant coil and the Rx resonant coil are arranged at a right angle or a specific angle of inclination relative to each other so that center axes of the Tx resonant coil and the Rx resonant coil are not parallel to each other, or the Tx resonant coil and the Rx resonant coil are arranged so that the center axes of the Tx resonant coil and the Rx resonant coil are parallel to each other but the center axes are not identical with each other, and the Rx resonant coil transfers the power to a device coil of an electronic device using the magnetic induction method.

In still another aspect of the present invention, a magnetic resonance wireless power transfer system, includes a source coil configured to be supplied with power from a source; a Tx resonant coil configured to be supplied with the power from the source coil using a magnetic induction method; an intermediate resonant coil supplied with power from the Tx resonant coil at a resonant frequency identical with that of the Tx resonant coil by magnetically-coupled resonance; and an Rx resonant coil configured to be supplied with the power from the intermediate resonant coil at a resonant frequency identical with that of the intermediate resonant coil via magnetically-coupled resonance, wherein the intermediate resonant coil is placed at a right angle or an angle of inclination relative to the Tx resonant coil and the Rx resonant coil, and the Rx resonant coil transfers the power to a device coil of an electronic device using an magnetic induction method.

The magnetic resonance (magnetically-coupled resonance) wireless power transfer system may further include an impedance matching circuit between the source and the source coil, or the device coil and a rectifier circuit or load of the electronic device.

Impedance matching may be performed by controlling the number of turns and size of the source coil or the Tx resonant coil and the Rx resonant coil even without using an impedance matching circuit.

An element, such as a lumped inductor or a capacitor, may be connected to both ends or intermediate portion of the magnetic resonant coil or the intermediate resonant coil. In this case, it is recommended that parasitic resistance of the element, such as an inductor or a capacitor, be several ohms or less. The element includes a lumped inductor having a high Q (quality) value (a high Q lumped inductor) and a capacitor. In addition, a structure capable of providing a precise capacitance value, such as a coaxial line, may be used as the element.

Since the proposed capacitor is used, a relatively low coil inductance value is required for the same resonant frequency ($f=1/(2\pi(LC)^{0.5})$) and therefore the length and volume of a coil can be reduced. In turn, the total volume of a resonant structure can be reduced. Although there may be a disadvantage in that efficiency is deteriorated when the capacitor is used, the tuning of Tx and Rx resonant frequencies that is problematic for the magnetic resonant structure becomes easy if a proper capacitor is used.

Here, it is preferred that in order to prevent the resonant frequency from changing as a result of the capacitance being changed by an influence, such as a contact with the human body or an alien substance, the capacitance value of the capacitor used, including the capacitance generated in the coil, be 100 pF or higher. Furthermore, in order to maintain a high Q factor, it is preferred that the sum of the capacitance generated in a coil and the capacitance of an added capacitor be 10 nF or lower.

Furthermore, the added capacitor may be used to minutely tune the resonant frequencies. That is, the transfer of power may be directly influenced by the precise tuning of the resonant frequencies of the Tx and Rx power resonant coils. Accordingly, the resonant frequencies of the Tx and Rx power resonant coils must be the same in order to maximize system efficiency, but the resonant frequency is changed by a parasitic effect even when the Tx and Rx power resonant coils have been fabricated to have the same structure, resulting in a sharp drop in efficiency. Thus, conducting a resonant frequency tuning process on the Tx and Rx power resonant coils is mandatory.

In particular, in order to precisely tune the resonant frequencies of the Tx and Rx power resonant coils, the capacitor may have a fixed capacitance and an inductor having low loss or a high Q factor may be used.

An electronic device may operate its internal circuit using power induced into the device coil of the electronic device, or may charge a battery with power obtained by rectifying power induced into the device coil.

An electronic device near the resonant coil of a power Rx unit may be provided with power in such a way that the resonant coil of a power Tx unit is embedded in an insulator wall and the resonant coil of the power receiving unit is embedded in a desk, a table, a space, another insulator wall, a pad or a container near the insulator wall.

The Tx resonant coil may directly transfer power to the Rx resonant coil, and also an intermediate resonant coil may also transfer stored power to the Rx resonant coil.

The Rx resonant coil may transfer power to the device coil of the electronic device using a magnetic induction method, and also the intermediate resonant coil may transfer power to the device coil of another electronic device using a magnetic induction method.

Advantageous Effects

According to the space-adaptive magnetic resonance wireless power transfer system and method according to the present invention, limitations present when applying power transfer to practical use using the existing parallel arrangement (i.e., when the center axes of Tx and Rx resonant coils are identical with each other) can be overcome. In the case of the existing parallel arrangement, when the distance between transmission and reception increases, there are frequent occasions in which a new intermediate coil may not be placed in parallel to Tx and Rx resonant coils (i.e., when the center axes of coils are identical with each other) because an obstacle is present between Tx and Rx coils or because the spatial limitation is imposed on Tx and Rx. For this reason, there is a limit to the reception of power using the existing parallel arrangement.

If the arrangement having a right angle or specific angle of inclination is used as in the present invention, however, the existing disadvantages may be negated because the power transmitting unit is contained in a wall or a place not visible. That is, since the resonant coils can be arranged to suit the surrounding environment, the effective power transmitting distance is greater, and the power transfer efficiency is improved. This is based on the characteristic that the magnetically-coupled resonance method is rarely influenced by an obstacle, such as the surface of a wall or water. A location where there is power transfer can be used as the position of the Rx resonant coil, and therefore the Tx resonant coil can be installed in the desired location. The Rx resonant coil can be placed under a desk or contained in the bottom because the Rx resonant coil is formed of only a coil in a helical or spiral form without additionally connecting an electric wire to the coil.

DESCRIPTION OF DRAWINGS

FIG. 9 shows a variation of the example of FIG. 2 illustrating a structure in which the Tx and Rx resonant coils are arranged such that the center axes of the Tx and Rx resonant coils are parallel to each other because the Tx and Rx resonant coils are not on the same plane, but the center axes are not identical with each other;

BEST MODE

Although preferred embodiments of the present will be described in detail with reference to the accompanying drawings and the descriptions of the drawings, the present invention is not limited or restricted to the embodiments.

The present invention will be described in detail below by describing the preferred embodiments with reference to the accompanying drawings.

Figure 1:
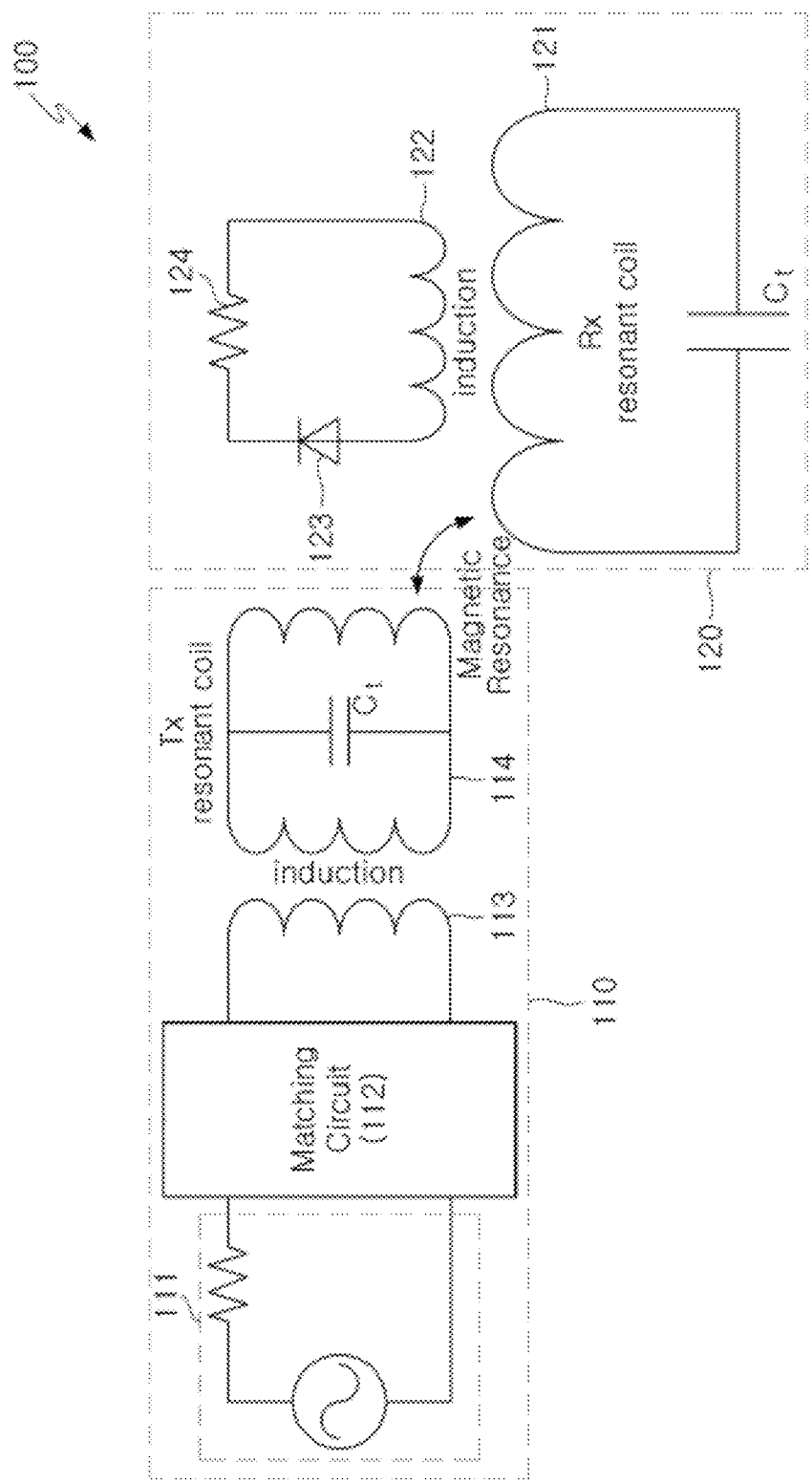
FIG. 1 is a circuit diagram showing the equivalent circuit of a space-adaptive magnetic resonance wireless power transfer system according to an embodiment of the present invention.

FIG. 1 shows the equivalent circuit of a space-adaptive magnetic resonance wireless power transfer system 100 according to an embodiment of the present invention.

Referring to FIG. 1, the space-adaptive magnetic resonance wireless power transfer system 100 according to an embodiment of the present invention includes a power transmitting (Tx) unit 110 and a power receiving (Rx) unit 120. The power transmitting unit 110 includes a source 111, a matching circuit 112, a source coil 113, and a Tx resonant coil 114 in helical or spiral form. The power receiving unit 120 includes a Rx resonant coil 121 in helical or spiral form, a device coil 122, a rectifier circuit 123, and load 124. Each of the Tx resonant coil 114 and the Rx resonant coil 121 may be formed of Litz wire, and may have various shapes in addition to the helical or spiral form. The Tx resonant coil 114 and the Rx resonant coil 121 may be made of superconducting material in order to reduce electrical resistance or ohmic loss. In order to reduce the size of the Tx resonant coil 114 and the Rx resonant coil 121, a magnetic body on which a wire is wound may be used for both the Tx resonant coil 114 and the Rx resonant coil 121. The Tx resonant coil 114 and the Rx resonant coil 121 may have a specific self-capacitance. If necessary, a lumped specific capacitor of a high Q value or an inductor of a high Q value may be additionally connected to both the Tx resonant coil 114 and the Rx resonant coil 121. For example, both electrodes of the capacitor or the inductor connected to the Tx resonant coil 114 or the Rx resonant coil 121 may be connected between both ends of the Tx resonant coil 114 or the Rx resonant coil 121, but the connection is not limited thereto. For example, only one of the electrodes of the capacitor or the inductor may be connected to both ends or one end of the Tx resonant coil 114 or the Rx resonant coil 121, or may be connected to the intermediate portion of the Tx resonant coil 114 or the Rx resonant coil 121. Here, the total capacitor $C_t$ of each of the Tx resonant coil 114 and the Rx resonant coil 121 includes a capacitor $C_o$ resulting from the coil itself and a capacitor $C_a$ additionally attached in order to perform resonant frequency tuning and to reduce the susceptibility to an external influence (only $C_t$ is shown in the drawing). Here, it is preferred that the sum of the capacitance of the capacitor $C_o$ and the capacitance of the capacitor $C_a$ be 100 pF or higher in order to prevent the resonant frequency from changing as a result of the capacitances of the capacitors being changed by an influence, such as a contact with human body or an alien substance. It is preferred that the sum of the capacitance of the capacitor $C_o$ and the capacitance of the capacitor $C_a$ be 10 nF or lower in order to maintain a high Q factor. The sum of the capacitance of the capacitor $C_o$ and the capacitance of the capacitor $C_a$ is not limited to the examples. For example, the sum of the capacitance of the capacitor $C_o$ and the capacitance of the capacitor Ca may be 100 pF or lower or 10 nF or higher depending on the system environment.

The power transfer mechanism is as follows. Power supplied from the source 111 is applied to the source coil 113 via the matching circuit 112. The source coil 113 transfers power to the Tx resonant coil 114 using a magnetic induction method based on a time-varying current applied via the matching circuit 112. The Tx resonant coil 114 continues to store power through self-resonance. When the Rx resonant coil 121 having the same resonant frequency is present, the Tx resonant coil 114 forms an energy transfer channel via strong magnetic coupling of evanescent magnetic field between the Tx and Rx resonant coils 114 and 121 and then transfers the stored power to the Rx resonant coil 121. The Tx resonant coil 114 and the Rx resonant coil 121 may transfer power over a low frequency band ranging from several hundreds of kHz to several MHz.

In the power transmitting unit 110, the matching circuit 112 is used between the source 111 and the source coil 113 to carry out impedance matching between the source coil 113 and the Tx resonant coil 114. However, impedance matching may be made to be automatically performed at the resonant frequency by controlling the number of turns and size (e.g., diameter) of the Tx resonant coil 114 and the Rx resonant coil 121 or the source coil 113 while taking into consideration the number of turns and size of the source coil 113 even in the absence of the matching circuit 112. Likewise, although not shown, an impedance matching circuit may be placed between both ends of the device coil 122 (e.g., between the device coil 122 and the rectifier circuit 123 or between the device coil 122 and the load 124), and the rectifier circuit 123 and the load 124 may be placed behind the impedance matching circuit. Even in this case, impedance matching may be automatically performed at the resonant frequency by controlling the number of turns and size of the device coil 122.

Figure 2:
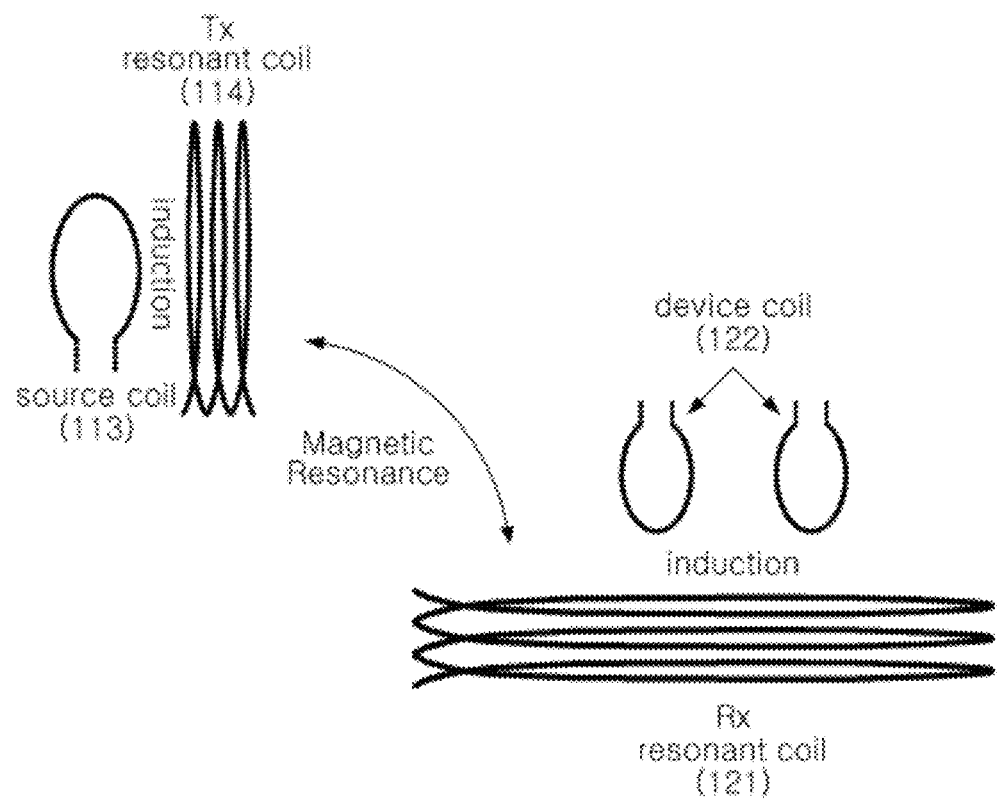
FIG. 2 is a diagram illustrating a power transfer method in the space-adaptive magnetically-coupled resonance wireless power transfer system according to an embodiment of the present invention.

FIG. 2 is a diagram illustrating a power transfer method in the space-adaptive magnetic resonance wireless power transfer system 100 according to an embodiment of the present invention.

In FIG. 2, energy is transmitted through magnetically-coupled resonance between the Tx and Rx resonant coils 114 and 121 arranged at a right angle or a specific angle of inclination. For example, the Tx resonant coil 114 may store energy that is received from the source coil using a magnetic induction method and, if the Rx resonant coil 121 having the same resonant frequency is present, the Tx resonant coil 114 may form an energy transfer channel via strong coupling of evanescent magnetic field with non-directive property between the Tx and Rx resonant coils 114 and 121 and transfer the stored power to the Rx resonant coil 121. The power transferred to the Rx resonant coil 121 may be induced in the device coil 122 near the Rx resonant coil 121, and power rectified by the rectifier circuit 123 may be used by the load 124 of a device. The device coil 122, the rectifier circuit 123, and the load 124 may be contained in the device (e.g., an electrical device), and the load 124 may be a battery, such as a secondary battery for charging power supplied via the rectifier circuit 123.

As may be seen from FIGS. 1 and 2, the power reception method proposed by the present invention refers to a power reception method which is performed when the Tx and Rx resonant coils 114 and 121 are arranged at a right angle or a specific angle of inclination and are not in a parallel arrangement as is common. In order for power irrespective of directionality to be efficiently transferred even at a right angle or a specific angle of inclination, the magnetic resonance method using the Tx and Rx resonant coils 114 and 121 having the same resonant frequency is used.

Figure 3:
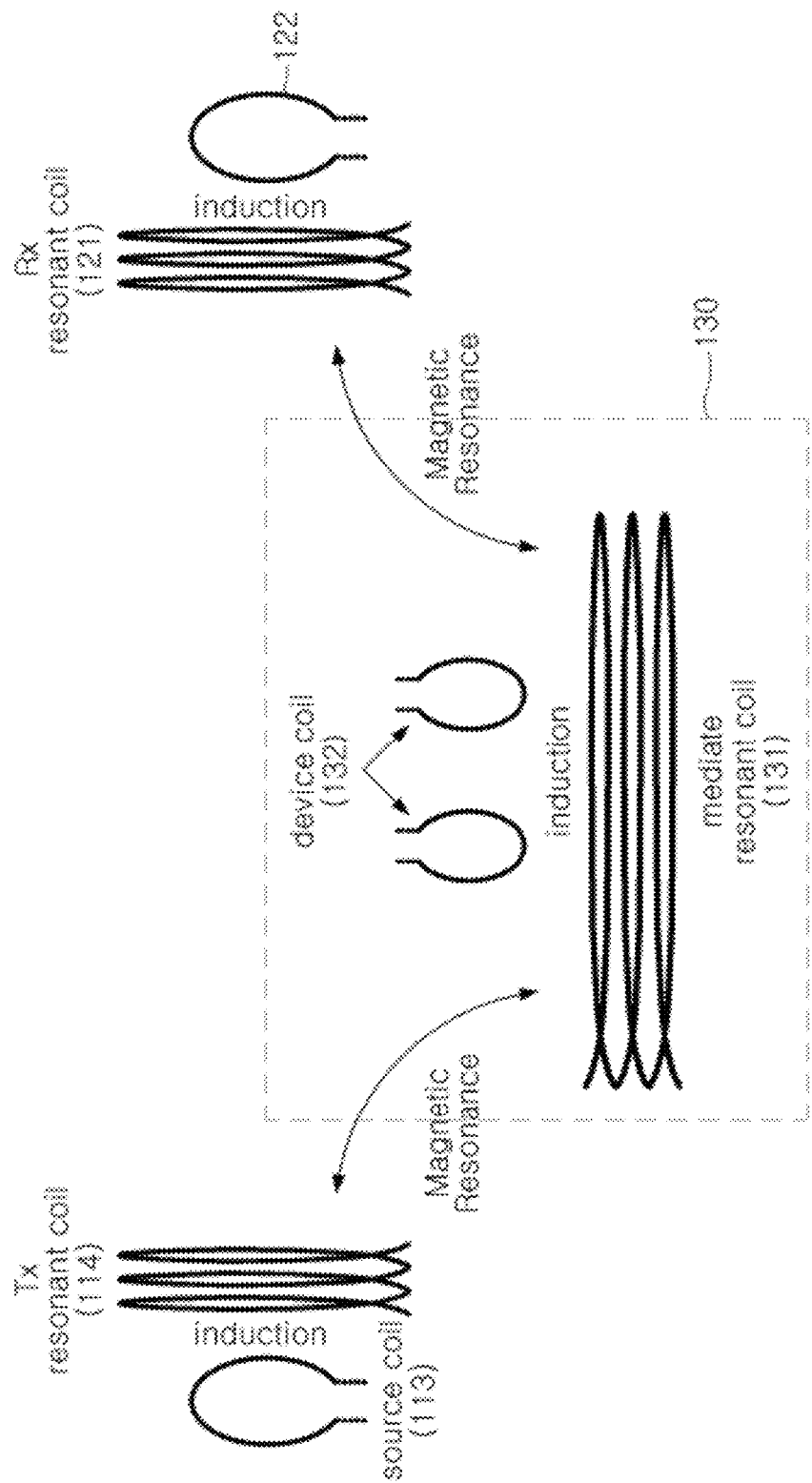
FIG. 3 is a diagram illustrating a space-adaptive magnetically-coupled resonance wireless power transfer system according to another embodiment of the present invention.

FIG. 3 is a diagram illustrating a space-adaptive magnetic resonance wireless power transfer system according to another embodiment of the present invention.

Referring to FIG. 3, the space-adaptive magnetic resonance wireless power transfer system according to another embodiment of the present invention may further include a Tx intermediate unit 130, including an intermediate resonant coil 131 in a helical or spiral form and an intermediate device coil 132 (the intermediate device coil may be omitted if needed), between the power Tx unit 110 and the power Rx unit 120, in addition to the power Tx unit 110 and the power Rx unit 120 which are described in conjunction with FIG. 1. The intermediate resonant coil 131 may also be formed of Litz wire, and may have various forms in addition to a helical or spiral form. The intermediate resonant coil 131 may be made of super-conducting material in order to reduce electrical resistance. In order to reduce the size of the intermediate resonant coil 131, a wire may be wound around a magnetic body. Furthermore, although not shown, the intermediate resonant coil 131 may also have a specific capacitance component. A lumped specific capacitor of a high Q value or an inductor of a high Q value may be connected to the intermediate resonant coil 131 if necessary. For example, both electrodes of the capacitor or the inductor connected to the intermediate resonant coil 131 may be connected between both ends of the intermediate resonant coil 131, but the connection is not limited thereto. For example, only one of the electrodes of the capacitor or the inductor may be connected to both ends or one end of the intermediate resonant coil 131, or may be connected to the intermediate portion of the intermediate resonant coil 131.

Here, the total capacitor $C_t$ of the intermediate resonant coil 131 includes a capacitor $C_o$ resulting from the intermediate resonant coil 131 itself and a capacitor $C_a$ of the capacitor additionally attached in order to tune the resonant frequency and to reduce the susceptibility to an external influence. Here, it is preferred that the sum of the capacitance of the capacitor $C_o$ and the capacitance of the capacitor $C_a$ be 100 pF or higher in order to prevent the resonant frequency from changing as a result of the capacitance of the capacitor being changed by an influence, such as a contact with the human body or an alien substance. It is preferred that the sum of the capacitance of the capacitor $C_o$ and the capacitance of the capacitor Ca be 10 nF or lower in order to maintain a high Q factor. The sum of the capacitance of the capacitor $C_o$ and the capacitance of the capacitor $C_a$ is not limited to the examples. For example, the sum of the capacitance of the capacitor $C_o$ and the capacitance of the capacitor $C_a$ may be 100 pF or lower or 10 nF or higher depending on the system environment.

In FIG. 3, the intermediate resonant coil 131 of the Tx intermediate unit 130 is arranged at a right angle relative to the Tx resonant coil 114 and the Rx resonant coil 121. Here, the Tx resonant coil 114 and the Rx resonant coil 121 may be parallel to each other. However, the Tx resonant coil 114 and the Rx resonant coil 121 are not always arranged in parallel because the intermediate resonant coil 131 may be arranged at a specific angle of inclination relative to the Tx resonant coil 114 and the Rx resonant coil 121. The Tx intermediate unit 130 itself may function as a power receiving unit so that the intermediate resonant coil 131 can relay power from the Tx resonant coil 114 in order to increase the power transfer distance and can rectify power induced into the device coil 132 in order for power to be used for load of a electronic device. Strong magnetic coupling may be generated between the Tx resonant coil 114 and the intermediate resonant coil 131 at the same resonant frequency via magnetically-coupled resonance as described above, and power stored in the intermediate resonant coil 131 may be transferred to the Rx resonant coil 121 via the strong magnetic coupling based on the magnetic resonance. Furthermore, if the device coil 132 or 122 is placed near the Rx resonant coil 121 or the intermediate resonant coil 131, power may be transferred to the device coil 132 or 122 using a magnetic induction method.

Figure 4:
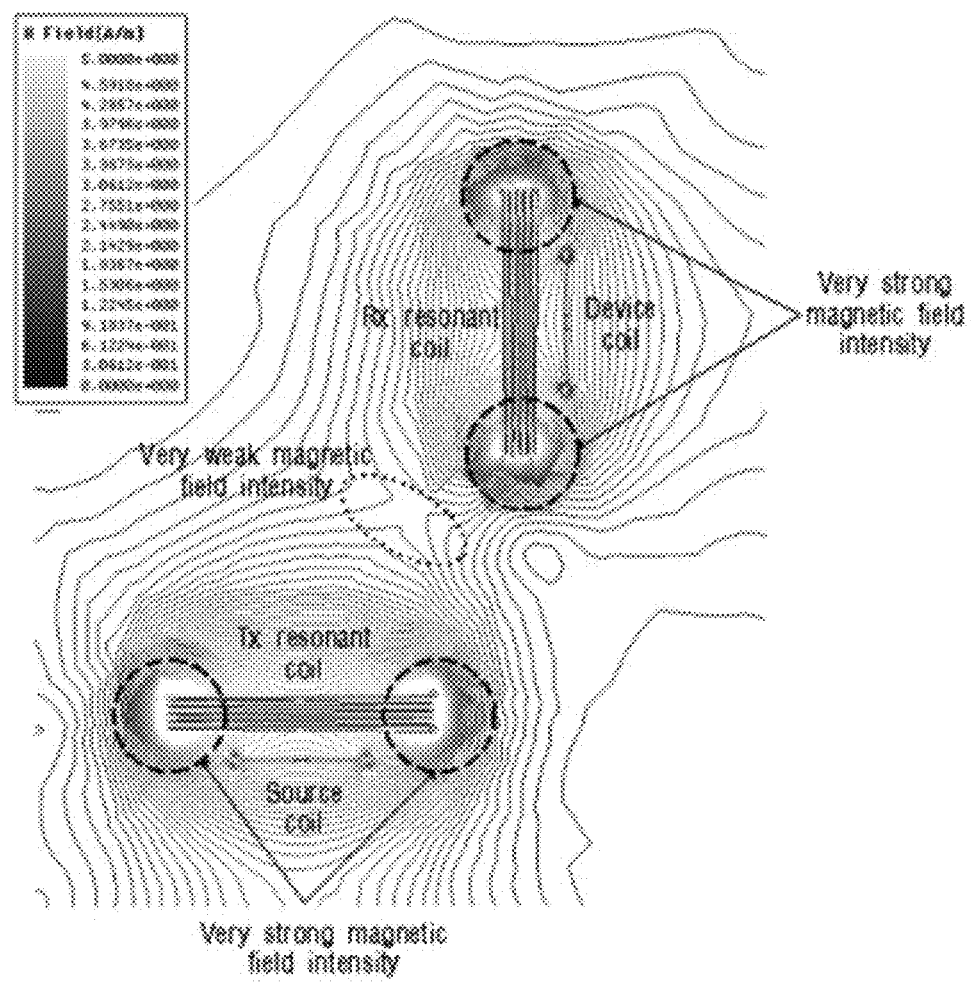
FIG. 4 is a diagram illustrating magnetic field patterns when Tx and Rx resonant coils are arranged at a right angle, as shown in FIG. 2.

FIG. 4 is a diagram illustrating magnetic field patterns when the Tx and Rx resonant coils are arranged at a right angle as shown in FIG. 2.

For a contour line distribution of the intensity of a magnetic field such as that shown in FIG. 4, a reduction in the interval between contour lines means that the intensity of a magnetic field is great. From FIG. 4, it may be seen that a very strong magnetic field is formed only around the Tx resonant coil 114 and the Rx resonant coil 121 and that magnetic resonance is generated between the two resonant coils. The Tx and Rx resonant coils 114 and 121 in helical form used for simulations were the same, the diameter of the coils was 4 mm, the number of turns of the coils was 5, the diameter of the coils was 20 cm, and the pitch was 0.54 cm. The resonant frequency was 28 MHz in theoretical calculations, but was actually found to be 22 MHz. The resonant frequencies of the theoretical value and the actual value were different, but it was found that resonance occurred between the Tx and Rx resonant coils 114 and 121 having the same resonant frequency. From FIG. 4, it may be seen that a magnetic field is not radiated between the Tx and Rx resonant coils 114 and 121 having the same resonant frequency and the tails of evanescent field present around the coils are interconnected. It may be seen that this mutual coupling has almost no influence on the arrangement of the Tx and Rx resonant coils 114 and 121.

Figure 5:
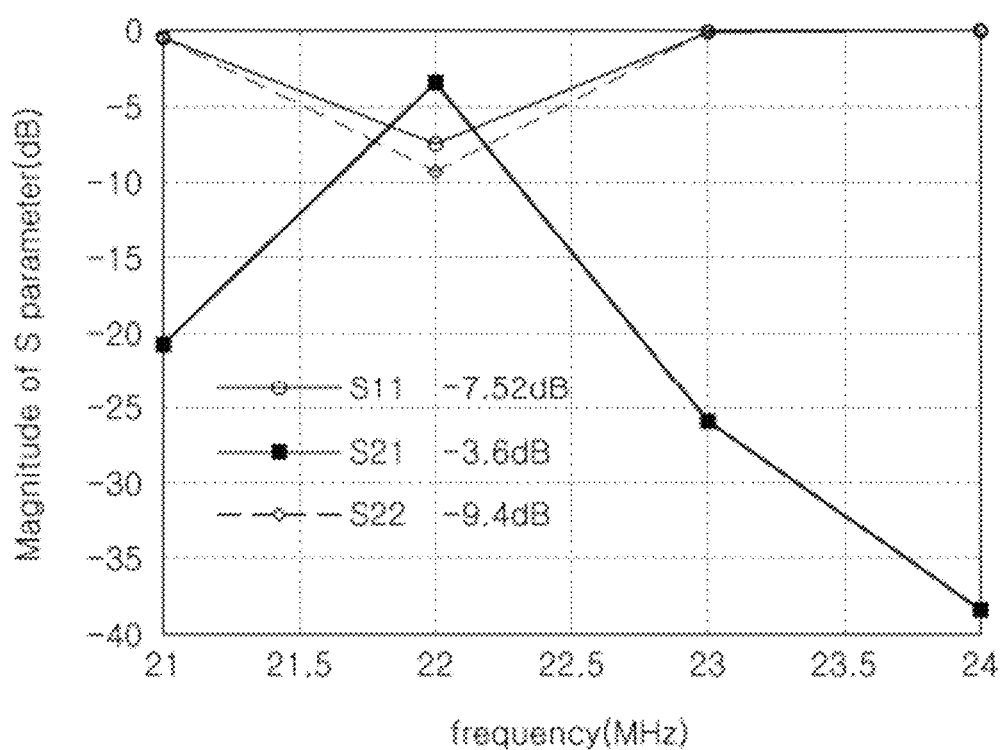
FIG. 5 shows the scattering (S) parameters obtained by the simulations of FIG. 4.

FIG. 5 shows the result of scattering (S) parameters obtained by the simulations of FIG. 4. The source coil 113 had a port having an impedance of 50Ω in order to excite a signal, and the device coil 122 also had a port having an impedance of 50Ω. From FIG. 5, it may be seen that impedance is matched at a reflection coefficient of −7.52 dB in the case of the power transmitting unit 110 and at a reflection coefficient of −9.4 dB in the case of the power Rx unit 120 when each of the Tx and Rx resonant coils 114 and 121 has a resonant frequency of 22 MHz. As described above, impedance matching may be automatically performed at the same resonant frequency of the Tx and Rx resonant coils 114 and 121 by controlling the interval between the source coil 113 and the resonant coil 114 of the power transmitting unit 110 (or between the device coil and the Rx resonant coil) and the shape (or the number of turns or size) of the source coil (or device coil) even without adding an additional impedance matching circuit. The simulations revealed that the efficiency of power transfer between the Tx and Rx resonant coils 114 and 121 resulting from magnetic resonance was about 60% as a result of the influence stemming from the matching of the power Tx and Rx units 110 and 121 being compensated for when the distance between the Tx and Rx resonant coils 114 and 121 was 24 cm.

Figure 6:
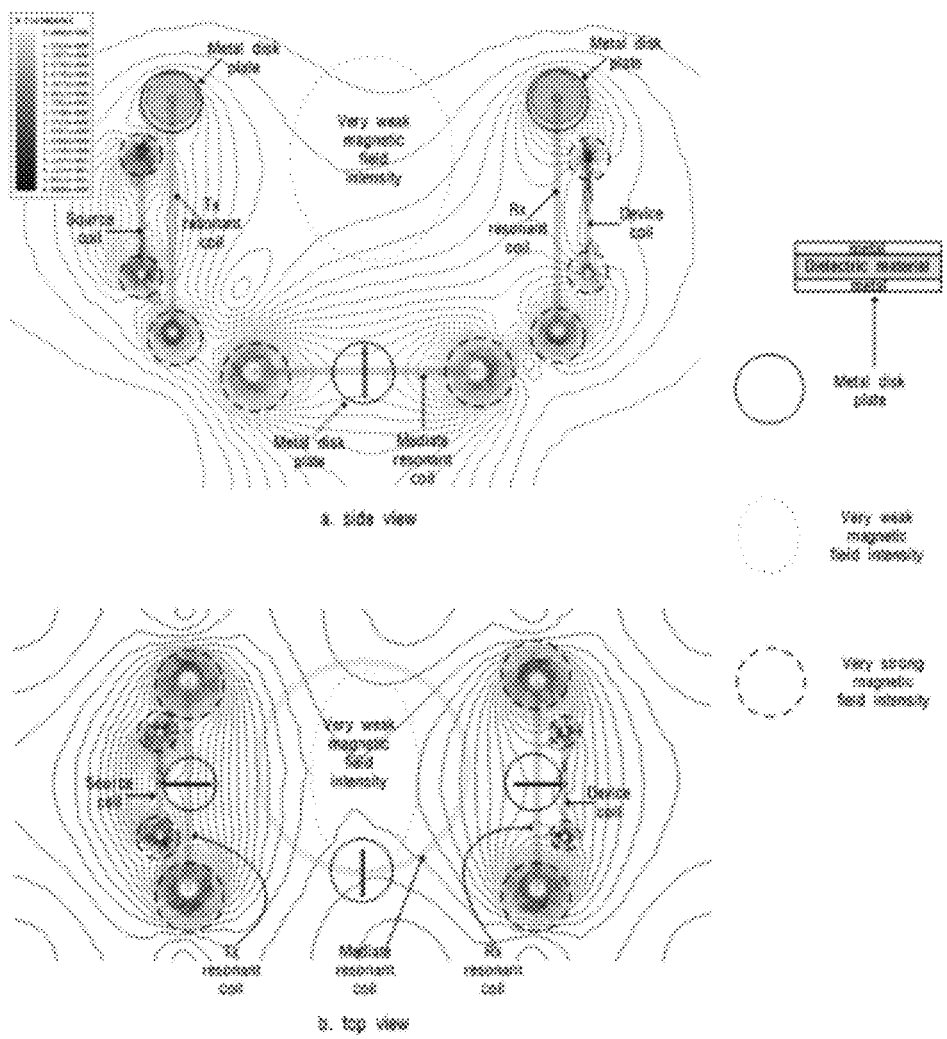
FIG. 6 is a diagram illustrating magnetic field patterns when an intermediate resonant coil is placed at a right angle relative to Tx and Rx resonant coils, as shown in FIG. 3.

FIG. 6 is a diagram illustrating magnetic field patterns when the intermediate resonant coil 131 is arranged at a right angle relative to the Tx and Rx resonant coils 114 and 121 as in FIG. 3. In FIG. 6, 'a' shows a magnetic field pattern when viewed from the side, and 'b' shows a magnetic field pattern when viewed from the top. FIG. 6 shows the results of the simulations of a magnetically-coupled resonance phenomenon using a single loop, connected to a flat type capacitor between both ends of the single loop, as the intermediate resonant coil 131. Here, an intermediate resonant coil disclosed in the reference document U.S. Patent Application Publication No. US 2007/0222542 A1 entitled "Wireless Non-Radiative Energy Transfer" was used as the intermediate resonant coil 131. The thickness of the conducting wire was 2 cm, the diameter of the loop was 60 cm, the interval between the disk plates of the flat type capacitor was 4 mm, the width of the disk plate was 138 cm², and the dielectric constant was 10. In this case, the resonant frequency of the loop was 7.8 MHz. It may be seen that the distance between the Tx and Rx resonant coils 114 and 121 was 1 m, but the power was transferred well up to the power receiving unit 120 thanks to the intermediate resonant coil 131 arranged at a right angle relative to the Tx and Rx resonant coils 114 and 121.

Figure 7:
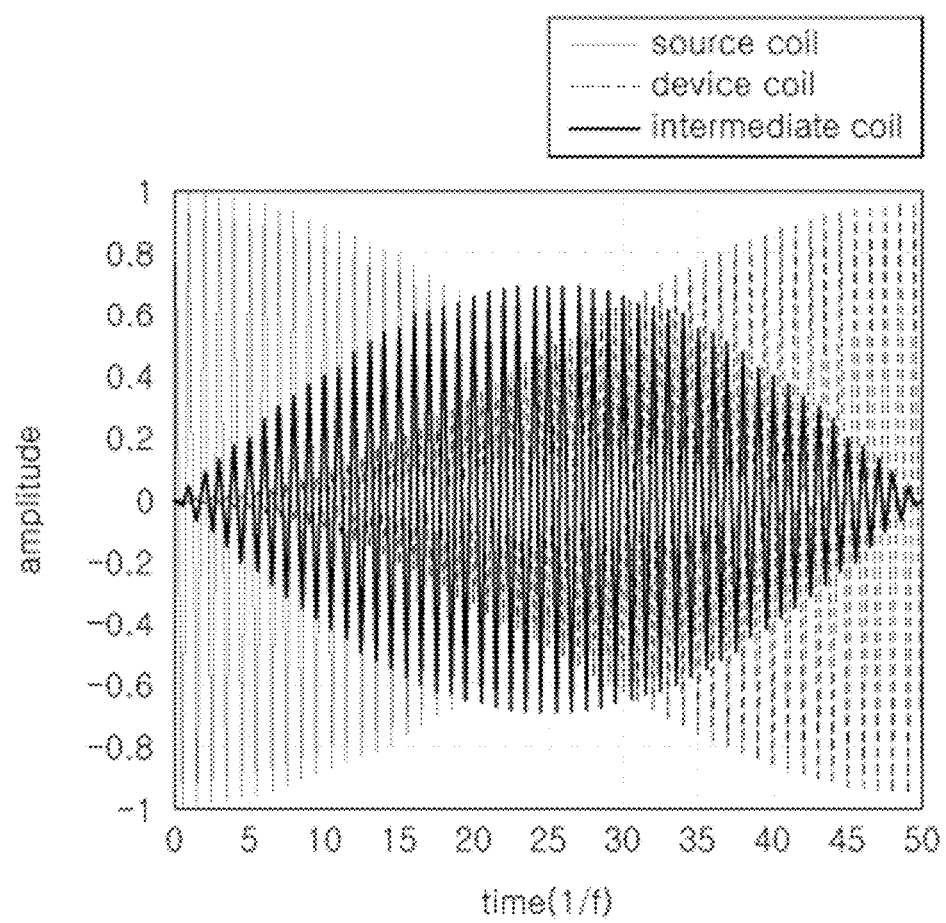
FIG. 7 shows the variations of evanescent wave modes or fields over time in coils when an intermediate resonant coil is used.

The basic principle will now be described in more detail. A coupling phenomenon between resonance coils having the same resonant frequency lies in that evanescent waves generated around the Tx resonant coil 114 are coupled with evanescent field generated in the Rx resonant coil 121 adjacent to the Tx resonant coil 114. This coupling phenomenon is shown in FIGS. 4 and 6. The evanescent waves are coupled at the shortest distance between the Tx resonant coil 114 and the Rx resonant coil 121. The amount of the coupling may be small, but a large amount of energy is transferred to the power receiving unit for a short time even by the small coupling if the attenuation of the evanescent field is generated slowly. This result may be the same as that shown in FIG. 7. That is, FIG. 7 shows the variations of evanescent field modes over time in the resonant coils 114, 121, and 131 when the intermediate resonant coil 131 of FIG. 6 is used. In FIG. 7, the evanescent field mode in the Tx resonant coil 114 continues to oscillate at a resonant frequency, and the size of the evanescent field gradually decreases. The intermediate resonant coil 131 is supplied with small amounts of power as described above, and the energy supplied from the intermediate resonant coil 131 is transferred to the Rx resonant coil 121. The energy may also be directly transferred from the Tx resonant coil 114 to the Rx resonant coil 121, but the amount of the energy is a lot smaller than the amount of the energy transferred through the intermediate resonant coil 131. In the existing magnetic induction, however, the transfer of power in a vertical direction at a small coupling strength is difficult because a great coupling strength is always required instead of this coupling phenomenon.

Figure 8A:
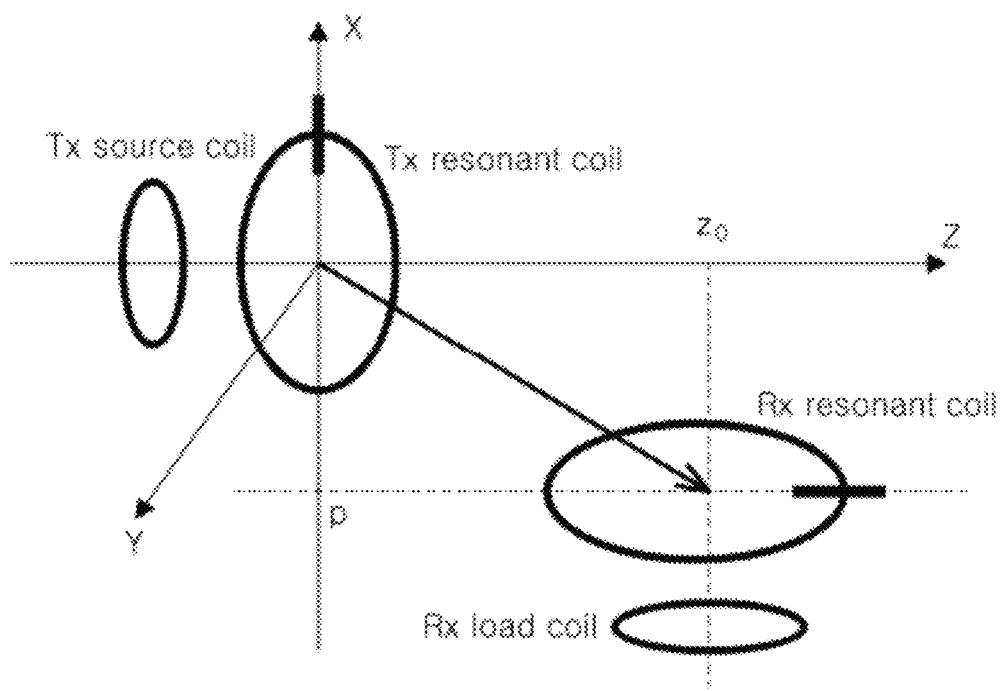
FIG. 8A shows a coordination system in which the resonant coil of a power transmitting unit and the resonant coil of a power receiving unit are disposed at a right angle.
Figure 8B:
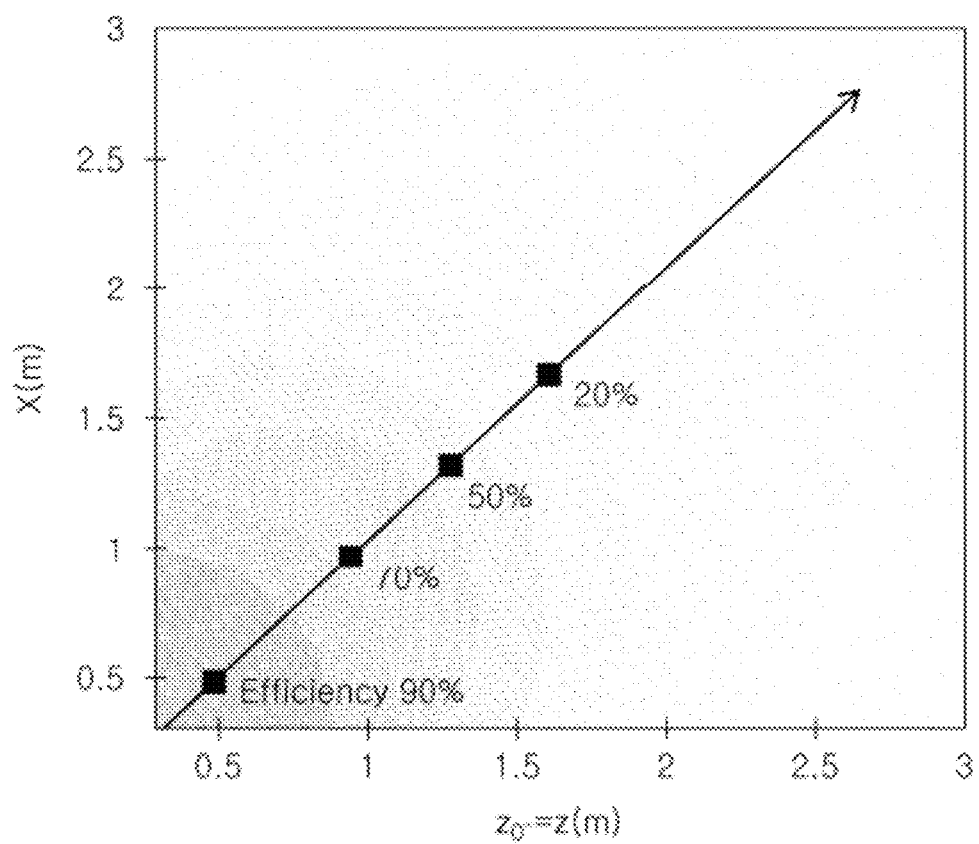
FIG. 8B is a diagram illustrating the variations in efficiency when the position of the Rx resonant coil is moved along the z axis.

In the proposed invention, however, unlike in the parallel arrangement (i.e., the resonant coils are arranged to have the same central axis), the resonant coils are arranged at a right angle or a specific angle of inclination. In this case, the transfer of power may be difficult in a section where coupling is sharply reduced. FIG. 8 shows a transfer characteristic for the vertical arrangement between the resonant coils. The Tx resonant coil 114 and the Rx resonant coil 121 were arranged at a right angle relative to each other as shown in FIG. 8A, and simulations were performed within one quadrant (¼). Here, a resonant coil disclosed in the reference document U.S. Patent Application Publication No. US 2007/0222542 A1 entitled "Wireless Non-Radiative Energy Transfer" was used as the resonant coils. The thickness of the conducting wire was 2 cm, the diameter of a loop was 60 cm, an interval between the disk plates of a flat type capacitor was 4 mm, the width of the disk plate was 138 cm², and the dielectric constant was 10. In this case, the resonant frequency of the loop was 7.8 MHz. From FIG. 8B, it can be seen that the efficiency varies when the position of the Rx resonant coil 121 is moved along the z axis. It can also be seen that transmission efficiency is 80% or higher at a specific distance or less. However, power transmission efficiency may be small near x=0 because a coupling coefficient is theoretically very small.

MODE FOR INVENTION

FIG. 9 shows a variation of the example of FIG. 2 in which the Tx and Rx resonant coils 114 and 121 may be inclined at a specific angle so that they are at a right angle or a specific angle of inclination relative to each other. FIG. 9 shows that the Tx and Rx resonant coils 114 and 121 may be arranged so that the center axes of the Tx and Rx resonant coils 114 and 121 are parallel to each other, but the center axes are not identical with each other because the Tx and Rx resonant coils are not on the same plane.

Figure 10:
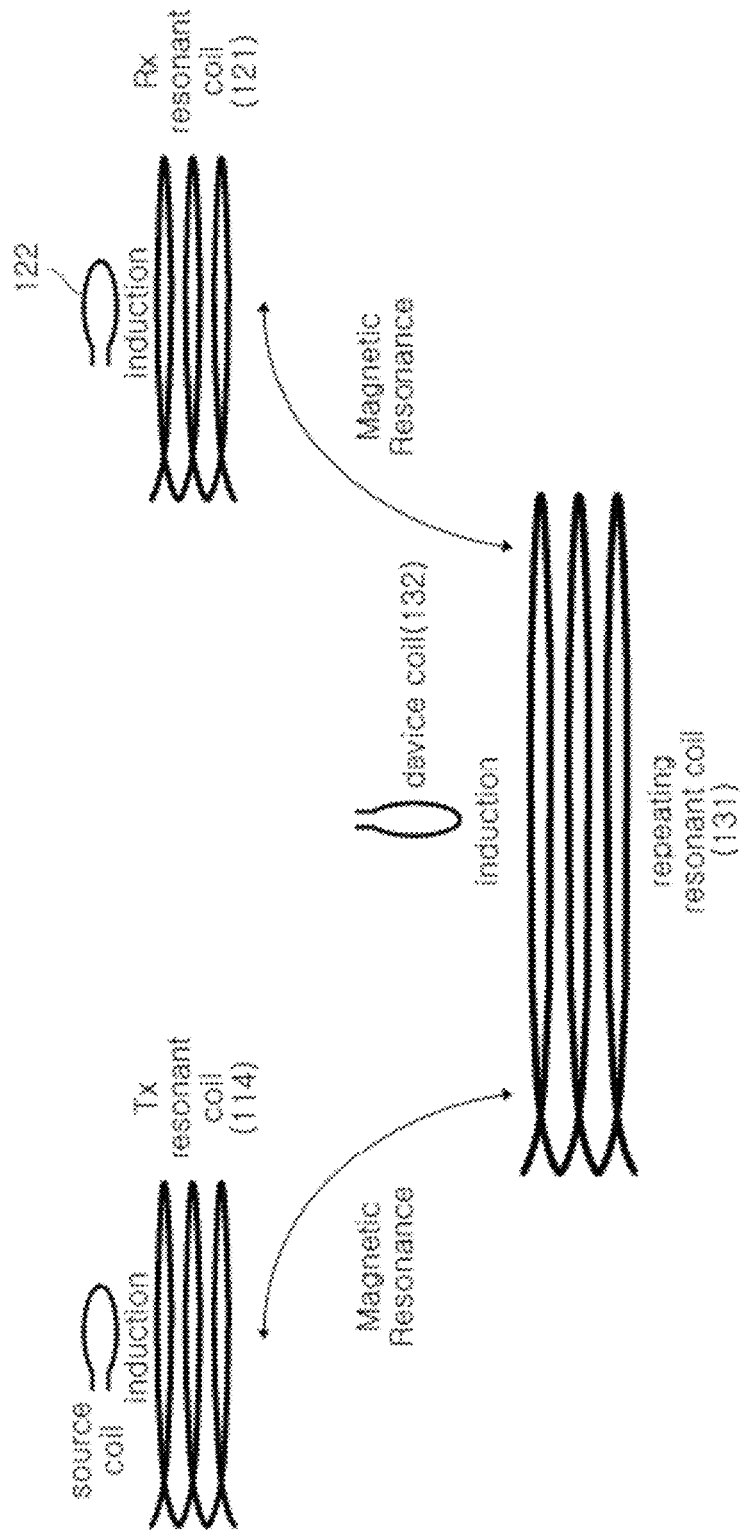
FIG. 10 shows a variation of the example of FIG. 3 illustrating a structure in which the intermediate resonant coil is placed such that the intermediate resonant coil is not on the same plane as the Tx and Rx resonant coils and the center axes of the resonant coils are parallel to each other but are not identical with each other.

FIG. 10 shows a variation of the example of FIG. 3 in which the intermediate resonant coil 131 may be inclined at a specific angle so that it makes a right angle or a specific angle of inclination relative to the Tx resonant coil 114 and the Rx resonant coil 121. FIG. 10 shows that the intermediate resonant coil 131 may be placed so that the intermediate resonant coil 131 is not on the same plane as the Tx resonant coil 114 and the Rx resonant coil 121 and the center axes of the resonant coils 131 and the resonant coils 114 and 121 are parallel to each other, but the center axes are not identical with each other.

Figure 11:
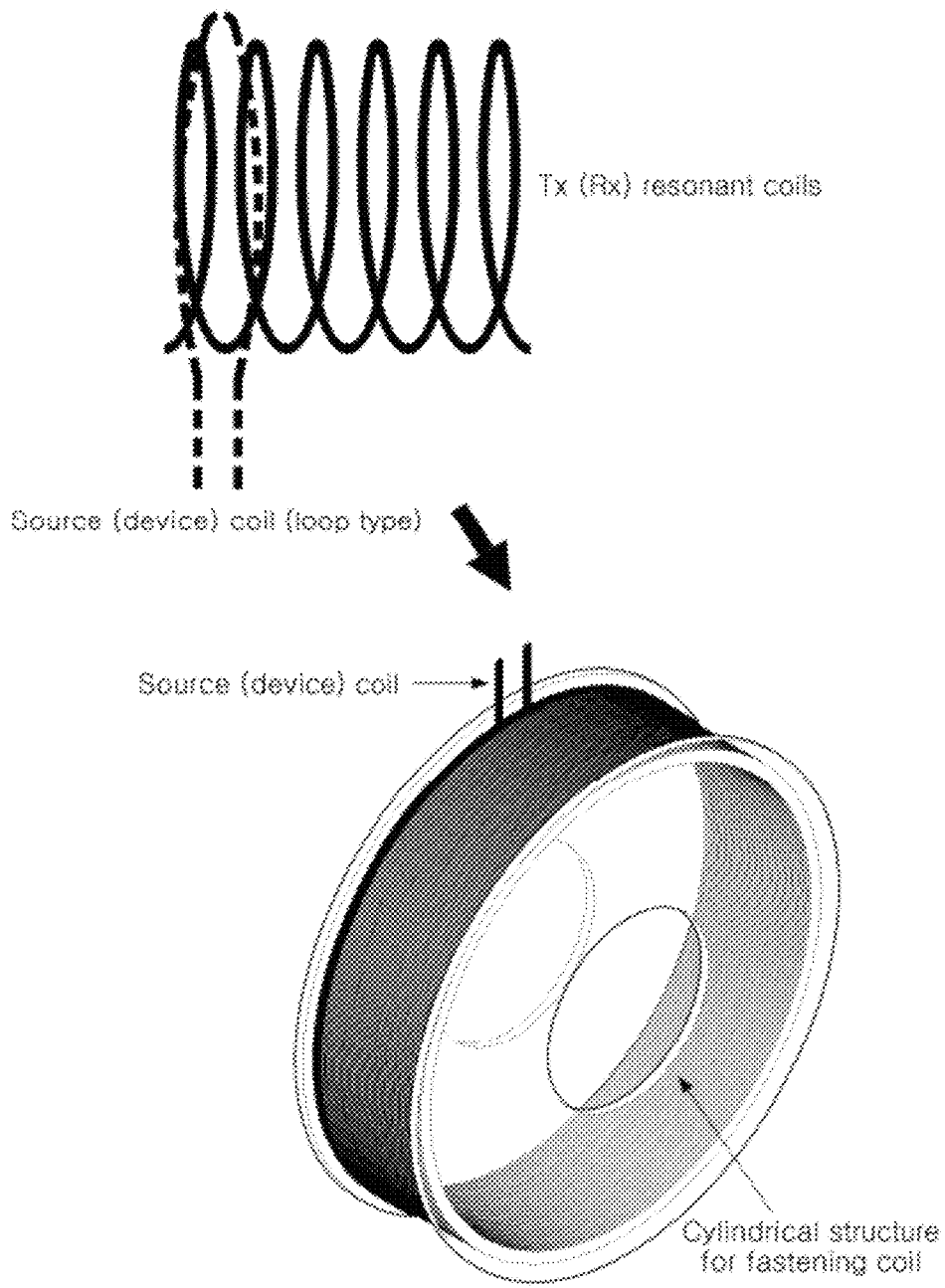
FIG. 11 is a helical coil fabricated to have a resonant frequency of 900 kHz.

FIG. 11 shows the configuration and photograph of a coil in helical form which was fabricated to have a resonant frequency of 900 kHz. The shape of the Tx resonant coil 114 and the Rx resonant coil 121 may be the same. The conducting wire used in this case was Litz wire having a diameter of 1 mm, the diameter of the coil was 26 cm, the height of the coil was 8 cm, and the number of turns of the coil was 78. The coil had a resistance of 3.2Ω, an inductance of 2.074 mH, and a Q factor (2 f L/R: L=inductance, R: conduction resistance+radiation resistance) of 3670. The number of turns of each of the source coil of the power transmitting unit and the device coil of the power receiving unit for magnetic induction with the resonant coil was 1. In particular, in order to obtain the same resonant frequency for the Tx resonant coil 114, the Rx resonant coil 121, and the intermediate resonant coil 131, the coil was wound using a cylindrical structure as shown in FIG. 11. A coil in helical form, such as that shown in FIG. 7, may be used as the Tx and Rx resonant coils 114 and 121 or the intermediate resonant coil 131.

Figure 12:
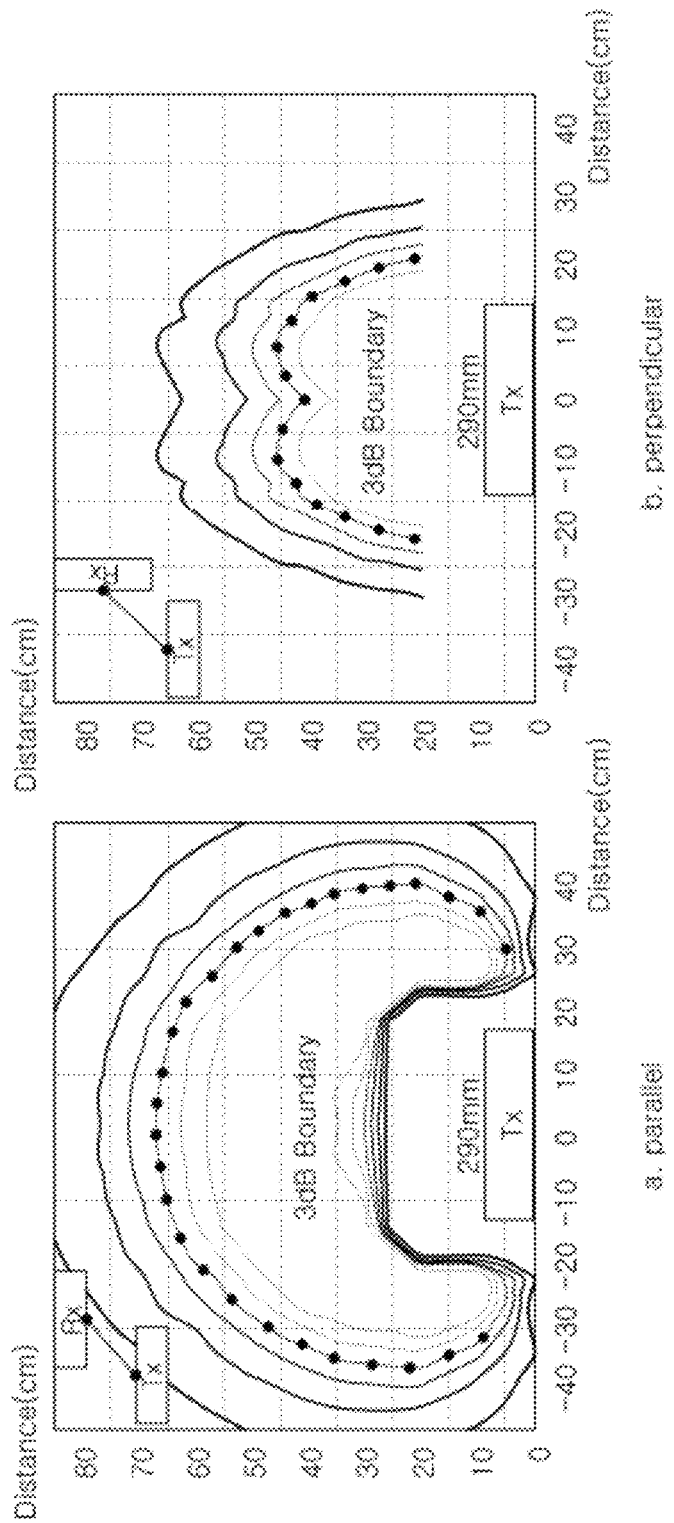
FIG. 12 is a diagram showing a region (i.e., a 3 dB boundary line) which exhibits a power transfer efficiency of 50% when a resonant coil, such as that shown in FIG. 11, is used in the Tx and Rx power units.

FIG. 12 is a diagram showing a region (i.e., a 3 dB boundary line) which exhibits a power transmission efficiency of 50% when a resonant coil, such as that shown in FIG. 11, is used in the transmitting and receiving power units. In this drawing, the 3 dB boundary line in 'a' shows efficiency measurements taken when moving the positions of the Tx and Rx resonant coils 114 and 121 in the state in which the Tx and Rx resonant coils 114 and 121 were parallel to each other. The 3 dB boundary line in 'b' shows efficiency measurements taken when moving the Tx and Rx resonant coils 114 and 121 in the state in which the Tx and Rx resonant coils 114 and 121 are arranged at a right angle, as shown in FIG. 1. If there is a power transmitting unit having a specific amount, the power transmitting unit may be supplied with power at an efficiency of 50% within the 3 dB boundary of the Tx resonant coil 114 even when the power receiving unit is placed in any direction. In FIG. 12, the space within the dotted line is the 3 dB region.

FIGS. 13 to 17 show examples in which the Tx and Rx resonant coils 114 and 121 are arranged at a right angle or a specific angle of inclination, not in a parallel arrangement, thereby improving applicability to practical use. The intermediate resonant coil 113 may be placed at a proper location around the Tx and Rx resonant coils 114 and 121, as in shown FIG. 3.

Figure 13:
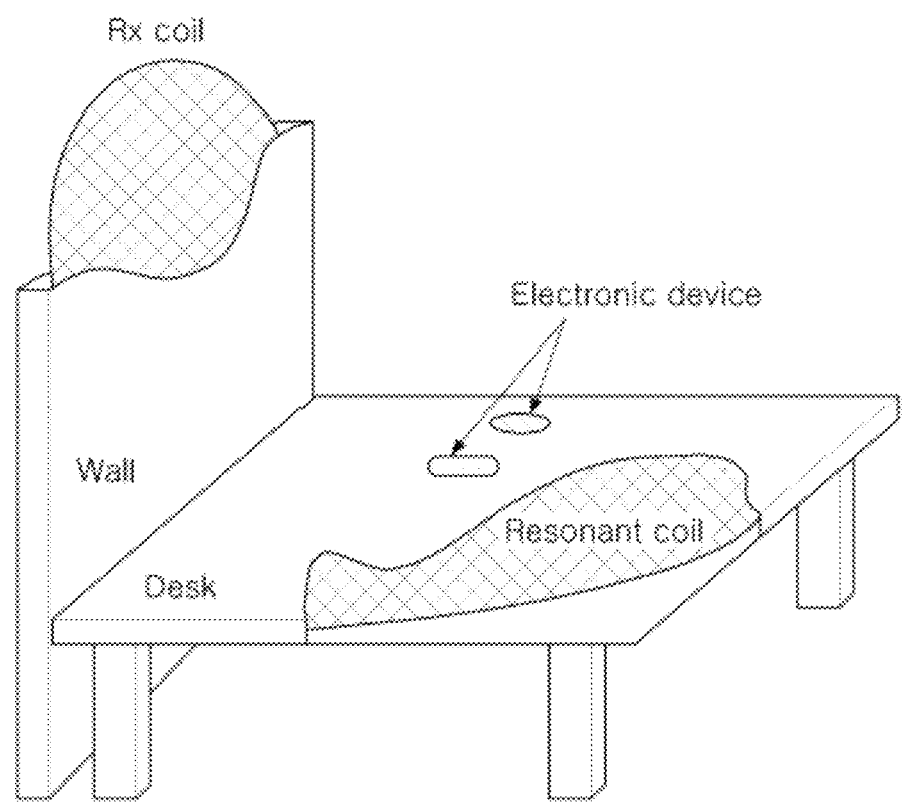
FIGS. 13 to 17 show examples in which applicability to practical use has been improved by arranging the Tx and Rx resonant coils 114 and 121 at a right angle or a specific angle of inclination such that they are not in parallel.

For example, as shown in FIG. 13, the Tx resonant coil 114 may be embedded in an insulator wall, the Rx resonant coil 121 may be embedded in a desk or a space under a desk that vertically adjoins the wall, and an electronic device (i.e., a device) may be supplied with power for purposes, such as charging, even when the electronic device has been placed in a space over the desk. Here, the electronic device may be a device including the device coil 122, the rectifier circuit 123, and the load 124, and power transferred from the Rx resonant coil 121 to the device coil 122 via induction may charge the load 124 (e.g., a battery) via the rectifier circuit 123.

Figure 14:
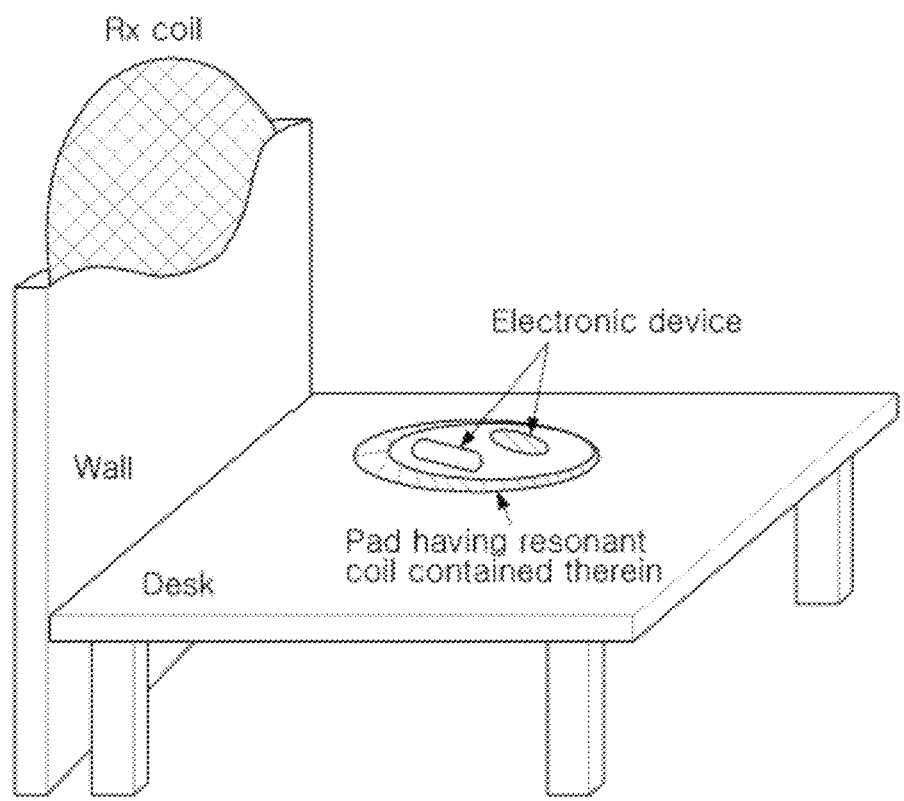

Furthermore, as shown in FIG. 14, the Tx resonant coil 114 may be embedded in an insulator wall, a pad having the small-sized Rx resonant coil 121 contained therein may be placed in a location, such as a space on a desk vertically adjacent to the wall, and an electronic device (i.e., a device) may be placed on or near the pad and supplied with power for purposes, such as charging.

Figure 15:
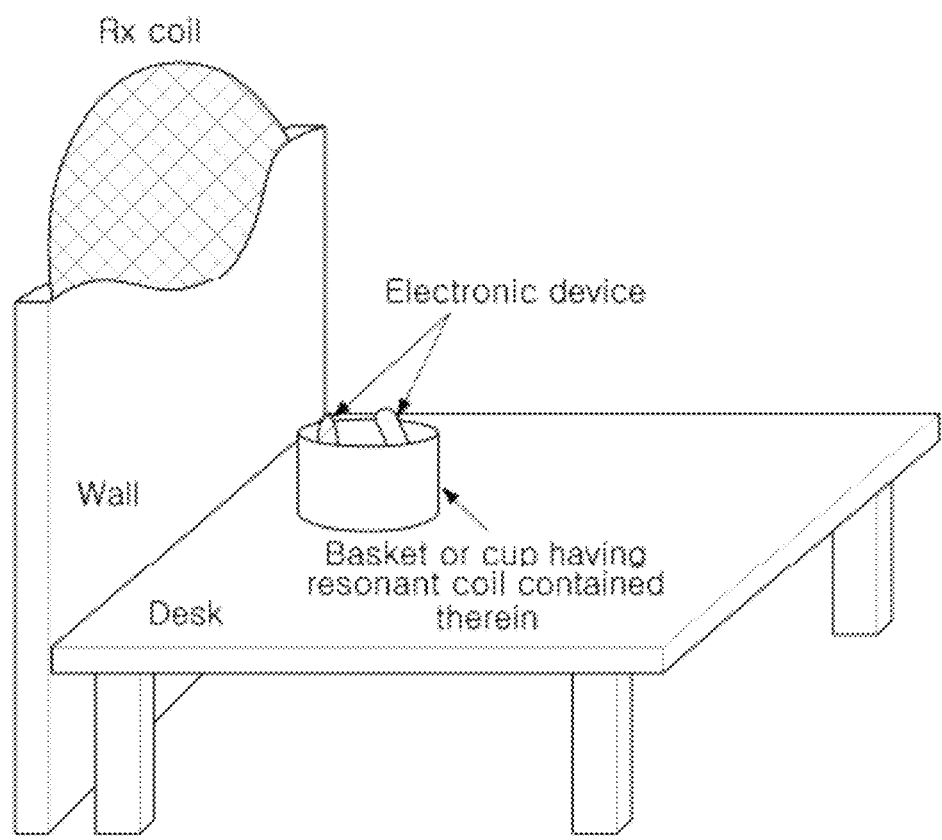

Furthermore, as shown in FIG. 15, the Tx resonant coil 114 may be embedded in an insulator wall, a container near the wall, such as a basket or cup having the Rx resonant coil 121 contained therein, may be place in a location, such as a space on a desk vertically adjacent to the wall, and an electronic device (i.e., a device) may be placed in the container and supplied with power for purposes, such as charging.

Figure 16:
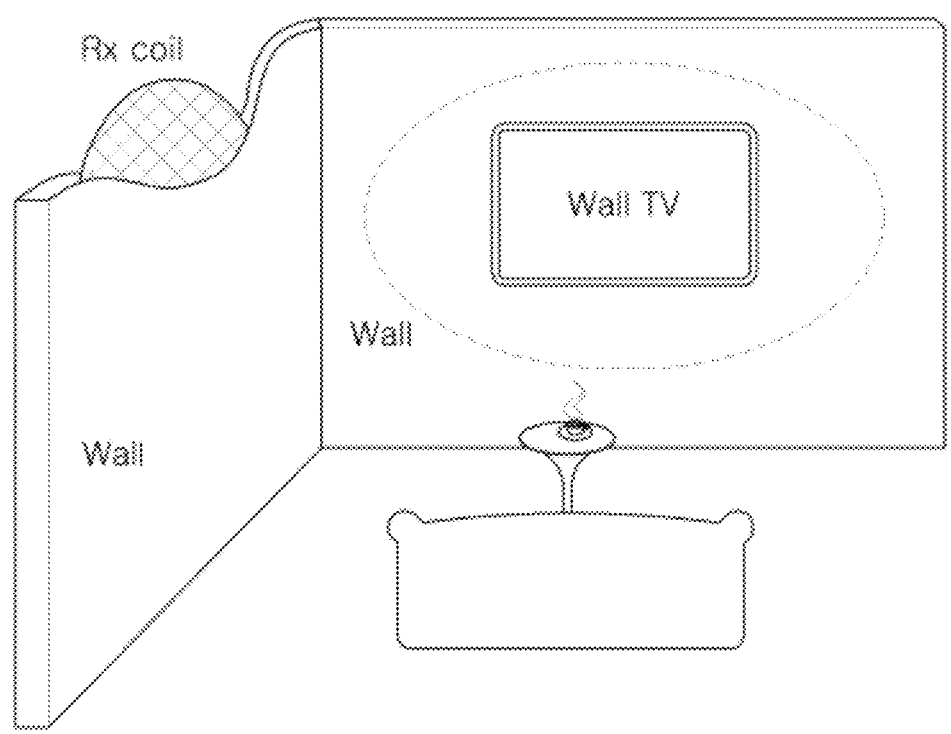

Furthermore, as shown in FIG. 16, the Tx resonant coil 114 may be embedded in an insulator wall on one side, the Rx resonant coil 121 may be embedded in an insulator wall on the other side vertical and adjacent to one side, and an electronic device, such as a wall TV or an electronic frame that may be hung on the wall, may be supplied with power. Here, the electronic device, such as wall TV or an electronic frame that may be hung on the wall, may be a device including the device coil 122, and power transferred from the Rx resonant coil 121 to the device coil 122 via induction may be used to operate the internal circuit of the electronic device or a display device.

Figure 17:
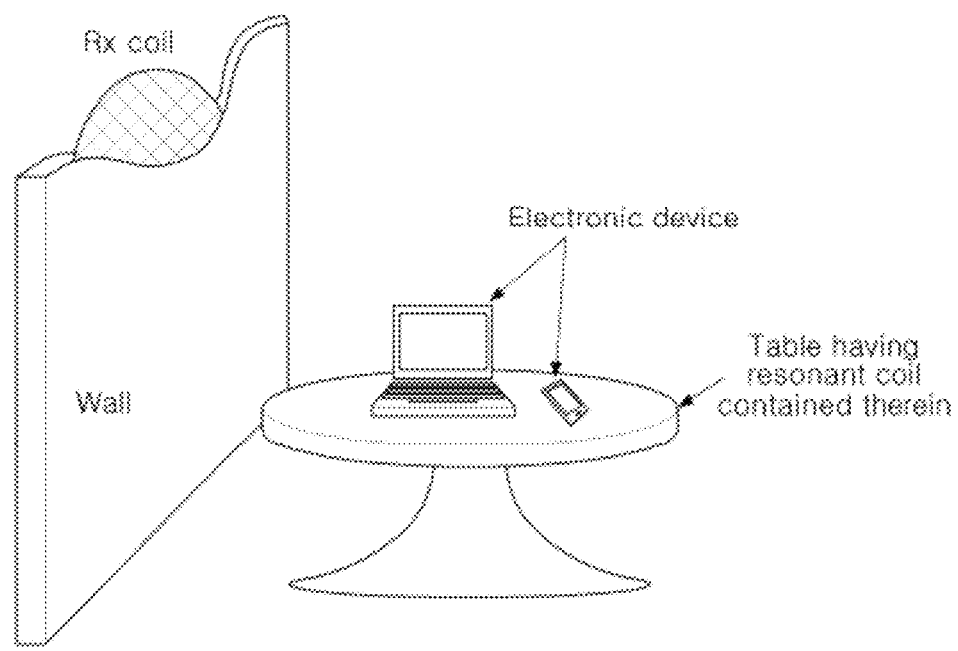

Furthermore, as shown in FIG. 17, the Tx resonant coil 114 may be embedded in an insulator wall, the Rx resonant coil 121 may be contained in a table near a location close to the wall or the Rx resonant coil 121 or may be embedded in the table, the Rx resonant coil 121 and the Tx resonant coil 114 may be arranged at a right angle relative to each other, and electronic devices, such as a laptop computer and a mobile phone on the table, may be supplied with power.

The Rx resonant coil 121 and the Tx resonant coil 114 are not necessarily arranged vertically (a direction in which the coil is wound is vertical), but may not be parallel to each other and may be inclined at a specific angle if necessary.

As described above, electronic devices each having the device coil 122 are placed at locations near the Rx resonant coil 121 so that the electronic devices may be supplied with power via magnetic induction by using the Rx resonant coil 121 and the Tx resonant coil 114 that may be arranged at a right angle or a specific angle of inclination, and power is supplied to the electronic devices. Accordingly, the electronic devices may be charged with power or may be operated. This method has a better advantage than the magnetic induction method or the horizontal arrangement method in terms of a fine beauty because the Tx resonant coil 114 is embedded in a wall and thus electric wires may be fully obviated. Furthermore, in the magnetic resonance method, power may be transferred without loss because power is less influenced by an object, such as a wall or desk.

As described above, in the space-adaptive magnetic resonance wireless power transfer system 100 according to the present invention, LC resonance is not generated by adding an artificial capacitor to a coil, but the Tx and Rx resonant coils 114 and 121 are configured using the magnetic resonance of a coil in helical or spiral form and the power Tx unit 110 and the power Rx unit 120 are arranged at a specific angle so that they make a right angle or specific angle of inclination. Accordingly, a limit inherent in the conventional parallel arrangement may be overcome, and power may be transferred more efficiently as compared with the magnetic induction method.

Although the present invention has been described in conjunction with a limited number of embodiments and with reference to the accompany drawings, the present invention is not limited to the above-described embodiments, but it will be apparent to those skilled in the art that a variety of modifications and variations are possible based on the above description. As a result, the scope of the present invention should not be determined based on only the above-described embodiments, but should be determined based on not only the claims but also equivalents to the claims.

The invention claimed is:

1. A magnetic resonance wireless power transfer method, comprising:

transferring power from a source coil to a transmitting (Tx) resonant coil using a magnetic induction method;

transferring the power from the Tx resonant coil to a receiving (Rx) resonant coil, having a resonant frequency identical with that of the Tx resonant coil, via magnetically-coupled resonance of magnetic evanescent field with non-directive property; and transferring the power from the Rx resonant coil to a device coil of an electronic device using the magnetic induction method;

wherein in order to transfer the power irrespective of directionality, the Tx resonant coil and the Rx resonant coil are arranged at a right angle or a specific angle of inclination relative to each other so that center axes of the Tx resonant coil and the Rx resonant coil are not parallel to each other, and wherein impedance matching at the source coil is performed by controlling the number of turns or size of the source coil or the interval between the source coil and the Tx resonant coil at a specific resonant frequency of the Tx resonant coil, or impedance matching at the device coil is performed by controlling the number of turns or size of the device coil or the interval between the device coil and the Rx resonant coil at the specific resonant frequency of the Rx resonant coil.

2. A magnetic resonance wireless power transfer method, comprising:

transferring power from a source coil to a Tx resonant coil using a magnetic induction method;

transferring the power from the Tx resonant coil to an intermediate resonant coil, having a resonant frequency identical with that of the Tx resonant coil, via magnetically-coupled resonance;

transferring the power from the intermediate resonant coil to an Rx resonant coil, having a resonant frequency identical with the Rx resonant coil, via magnetically-coupled resonance; and transferring the power from the Rx resonant coil to a device coil of an electronic device using a magnetic induction method;

wherein the intermediate resonant coil is placed at a right angle or an angle of inclination relative to the Tx resonant coil and the Rx resonant coil, and wherein impedance matching at the source coil is performed by controlling the number of turns or size of the source coil or the interval between the source coil and the Tx resonant coil at a specific resonant frequency of the Tx resonant coil.

3. A magnetic resonance wireless power transfer system, comprising:

a source coil configured to be supplied with power from a source;

a Tx resonant coil configured to be supplied with the power from the source coil using a magnetic induction method; and an Rx resonant coil configured to be supplied with the power from the Tx resonant coil at a resonant frequency identical with that of the Tx resonant coil via magnetically-coupled resonance of magnetic evanescent field with non-directive property, wherein in order to transfer the power irrespective of directionality, the Tx resonant coil and the Rx resonant coil are arranged at a right angle or a specific angle of inclination relative to each other so that center axes of the Tx resonant coil and the Rx resonant coil are not parallel to each other, and the Rx resonant coil transfers the power to a device coil of an electronic device using the magnetic induction method, and wherein impedance matching at the source coil is performed by controlling the number of turns or size of the source coil or the interval between the source coil and the Tx resonant coil at a specific resonant frequency of the Tx resonant coil, or impedance matching at the device coil is performed by controlling the number of turns or size of the device coil or the interval between the device coil and the Rx resonant coil at the specific resonant frequency of the Rx resonant coil.

4. The magnetic resonance wireless power transfer system as set forth in claim 3, further comprising at least one of an impedance matching circuit between the source and the source coil, an impedance matching circuit between the device coil and a rectifier circuit of the electronic device, and an impedance matching circuit between the device coil and load of the electronic device.

5. The magnetic resonance wireless power transfer system as set forth in claim 3, wherein at least one of the Tx resonant coil and the Rx resonant coil comprises:
a lumped inductor or capacitor whose two electrodes are connected between both ends of the at least one coil, or whose only one electrode is connected to one of both ends of the at least one coil, to both ends of the at least one coil, or to an intermediate portion of the at least one coil.

6. The magnetic resonance wireless power transfer system as set forth in claim 3, wherein the Tx resonant coil is embedded in a wall or a board, the Rx resonant coil is embedded in a desk or a table, a space, another wall, a pad, or a container near the wall, and the electronic device near the Rx resonant coil is supplied with the power.

7. The magnetic resonance wireless power transfer system as set forth in claim 3, wherein the Tx resonant coil or the Rx resonant coil has a helical or spiral form.

8. The magnetic resonance wireless power transfer system as set forth in claim 4, wherein the impedance matching circuit includes a coaxial cable to provide a capacitance value.

9. The magnetic resonance wireless power transfer system as set forth in claim 5, wherein a sum of a capacitance of the at least one coil itself to which the capacitor is additionally coupled and a capacitance of the added capacitor is equal to or higher than 100 pF and equal to or lower than 10 nF.

10. The magnetic resonance wireless power transfer system as set forth in claim 7, wherein the Tx resonant coil or the Rx resonant coil has a form in which a wire is wound around a magnetic body.

11. A magnetic resonance wireless power transfer system, comprising:
a source coil configured to be supplied with power from a source;
a Tx resonant coil configured to be supplied with the power from the source coil using a magnetic induction method;
an intermediate resonant coil supplied with power from the Tx resonant coil at a resonant frequency identical with that of the Tx resonant coil using a magnetic resonance mechanism; and
an Rx resonant coil configured to be supplied with the power from the intermediate resonant coil at a resonant frequency identical with that of the intermediate resonant coil via magnetically-coupled resonance,
wherein the intermediate resonant coil is placed at a right angle or an angle of inclination relative to the Tx resonant coil and the Rx resonant coil, and the Rx resonant coil transfers the power to a device coil of an electronic device using a magnetic induction method, and wherein impedance matching at the source coil is performed by controlling the number of turns or size of the source coil or the interval between the source coil and the Tx resonant coil at a specific resonant frequency of the Tx resonant coil.

12. The magnetic resonance wireless power transfer system as set forth in claim 11, wherein at least one of the Tx resonant coil, the Rx resonant coil, and the intermediate resonant coil comprises;
a lumped inductor or a capacitor whose two electrodes are connected between both ends of the at least one coil, or whose only one electrode is connected to one of both ends of the at least one coil, to both ends of the at least one coil, or to an intermediate portion of the at least one coil.

13. The magnetic resonance wireless power transfer system as set forth in claim 11, wherein the Tx resonant coil, the Rx resonant coil, or the intermediate resonant coil has a helical or spiral form.

14. The magnetic resonance wireless power transfer system as set forth in claim 11, wherein the Tx resonant coil directly transfers the power to the Rx resonant coil and simultaneously the intermediate resonant coil transfers the stored power to the Rx resonant coil.

15. The magnetic resonance wireless power transfer system as set forth in claim 11, wherein the Rx resonant coil transfers the power to the device coil of the electronic device using the magnetic induction method, and simultaneously the intermediate resonant coil transfers the power to a device coil of another electronic device using the magnetic induction method.

16. The magnetic resonance wireless power transfer system as set forth in claim 11, further comprising an impedance matching circuit between the source and the source coil, or the device coil and a rectifier circuit or load of the electronic device.

17. The magnetic resonance wireless power transfer system as set forth in claim 11, wherein impedance matching at the device coil is performed by controlling the number of turns or size of the device coil or the interval between the device coil and the Rx resonant coil at the specific resonant frequency of the Rx resonant coil, even without using an impedance matching circuit.

18. The magnetic resonance wireless power transfer system as set forth in claim 12, wherein a sum of a capacitance of the at least one coil itself to which the capacitor is additionally coupled and a capacitance of the added capacitor is equal to or higher than 100 pF and equal to or lower than 10 nF.

19. The magnetic resonance wireless power transfer system as set forth in claim 11, wherein the Tx resonant coil is embedded in a wall or a board, the Rx resonant coil is embedded in a desk or a table, a space, another wall, a pad, or a container near the wall, and the electronic device near the Rx resonant coil is supplied with the power.

20. The magnetic resonance wireless power transfer system as set forth in claim 11, wherein the Tx resonant coil, the intermediate resonant coil and the Rx resonant coil are arranged so that the center axes of the Tx resonant coil, the intermediate resonant coil and the Rx resonant coil are parallel to each other, but the center axes are not identical with each other.

21. The magnetic resonance wireless power transfer system as set forth in claim 13, wherein the Tx resonant coil, the Rx resonant coil, or the intermediate resonant coil has a form in which a wire is wound around a magnetic body.

* * * * *